United States Patent
Chai et al.

(10) Patent No.: US 6,471,881 B1
(45) Date of Patent: Oct. 29, 2002

(54) THERMAL BARRIER COATING HAVING IMPROVED DURABILITY AND METHOD OF PROVIDING THE COATING

(75) Inventors: Yan Chai, New Haven, CT (US); Gary M. Lomasney, Glastonbury, CT (US); Keith Douglas Sheffler, Wethersfield, CT (US)

(73) Assignee: United Technologies Corporation, Hartford, CT (US)

( * ) Notice: Subject to any disclaimer, the term of this patent is extended or adjusted under 35 U.S.C. 154(b) by 0 days.

(21) Appl. No.: 09/447,762

(22) Filed: Nov. 23, 1999

(51) Int. Cl.[7] .............................. B44C 1/22; C23F 1/00
(52) U.S. Cl. ........................ 216/39; 216/65; 216/100; 428/173; 428/601
(58) Field of Search .............................. 216/37, 39, 65, 216/100; 428/173, 601

(56) References Cited

U.S. PATENT DOCUMENTS

| | | | |
|---|---|---|---|
| 5,043,138 A | 8/1991 | Darolia et al. | 420/443 |
| 5,419,971 A | 5/1995 | Skelley et al | 428/612 |
| 5,435,889 A | 7/1995 | Dietrich | 216/63 |

*Primary Examiner*—William A. Powell
(74) *Attorney, Agent, or Firm*—F. Tyler Morrison

(57) ABSTRACT

A method is disclosed for providing a TBC system including grooves or other features between the bond coat/substrate and the ceramic thermally insulating layer. The features are initially provided by selectively removing material to define the features, for example by laser. Any disturbed surface layer, e.g., re-cast material in the case of a laser or plastically worked material in the case of machining, is then chemically removed, leaving the remaining material with a microstructure of a more uniform geometry, and free of disturbed material. The ceramic layer is then applied. TBC systems using the method show improved durability, with lives up to 4x longer than prior TBC systems.

20 Claims, 4 Drawing Sheets

THERMAL BARRIER COATING HAVING IMPROVED DURABILITY AND METHOD OF PROVIDING THE COATING

FIELD OF THE INVENTION

The present invention relates generally to thermal barrier coatings and coating systems, and relates more particularly to coatings and coating systems having improved durability.

BACKGROUND OF THE INVENTION

Gas turbine engines are well developed mechanisms for converting chemical potential energy, in the form of fuel, to thermal energy and then to mechanical energy for use in propelling aircraft, generating electric power, pumping fluids, etc. The metallic materials used in gas turbine engines are currently very near the upper limits of their thermal stability. In the hottest portion of modern gas turbine engines, metallic materials are used at gas temperatures above their melting points. They survive because they are air cooled. But providing air cooling reduces engine efficiency. Accordingly, there has been extensive development of thermal barrier coatings for use with cooled gas turbine aircraft hardware. By using a thermal barrier coating, the amount of cooling air required can be substantially reduced, thus providing a corresponding increase in efficiency.

Generally speaking, metallic materials have coefficients of thermal expansion which exceed those of ceramic materials. Consequently, one of the problems that must be addressed in the development of successful thermal barrier coatings is to match the coefficient of thermal expansion of the ceramic material to the metallic substrate so that upon heating, when the substrate expands, the ceramic coating material does not crack. Zirconia has a high coefficient of thermal expansion and this is a primary reason for the success of zirconia as a thermal barrier material on metallic substrates.

Thermal barrier coatings are deposited by several techniques including thermal spraying (for example plasma, flame and HVOF), sputtering and vapor deposition such as electron beam physical vapor deposition (EBPVD). Of these techniques, electron beam physical vapor deposition is currently a preferred technique for demanding applications because it produces a unique coating structure. Electron beam physical vapor deposited ceramic materials, when applied according to certain parameters, have a columnar grain microstructure consisting of small columns separated by gaps which extend into the coating. These gaps allow substantial substrate expansion without coating cracking and/or spalling. See, e.g., commonly owned U.S. Pat. No. 4,321,311. According to U.S. Pat. No. 5,073,433 and commonly-owned U.S. Pat. No. 5,705,231, a similar structure (comprising segmentation cracks) although on a larger scale, can be obtained by plasma spray techniques.

In order to protect the substrate, the thermal barrier coating must continue to adhere to the substrate, or an intermediate bond coat, during the service life of the component. However, repeated thermal cycling of coated components results in repeated thermal cycling of the ceramic and metallic materials, and thermally induced stresses and strains. Failure of the system may occur at the metal/ceramic interface, between the bond coat and ceramic, or the substrate and ceramic where no bond coat is used. Such failure usually results in spallation of the coating, exposure of the underlying substrate, followed by failure of at least a portion of the underlying component.

One attempt to overcome the spallation problem is set forth in U.S. Pat. No. 5,419,971. The '971 patent asserts that grooves provided, e.g., in the bond coat, arrest cracks forming in the ceramic in the area of the ceramic/bond coat interface. The grooves are preferably provided in the bond coat using a pulsed laser, or other suitable process for selectively removing small amounts of the metallic bond coat material. The laser purportedly ablates material with "virtually no effect on the underlying material that is not removed". Other suitable methods include mechanical micro-machining and engraving processes. A conventional photoengraving process is described at col. 6, lines 24–60. An acid resistant coating is applied to substantially all of the substrate, except for a small portion, and the uncovered portion is etched with an acid to form the grooves. The acid-resistant covering, which prevents the acid from contacting most of the substrate, is then removed from the substrate.

The '971 patent specifically teaches that conventional chemical etching, in which the entire surface is exposed to etchant, is unsuitable in providing grooves or other features in the metallic material. According to the '971 patent, conventional chemical etching results in contamination and/or cracking the underlying material. See. e.g., col. 3, line 58–col. 4, line 8.

Testing of the subject matter discussed in the '971 patent indicates that a layer of highly disturbed material, e.g., re-cast material, exists along the outer surface of the grooves, and that the geometry of grooves are typically highly irregular. In the case of material removal by laser, the remaining re-cast material tends to be chemically altered by selective evaporation of chromium and also some aluminum and yttrium. Moreover, the re-cast material also tends to include a very fine grain structure, which exhibits poor high temperature strength relative, for example, to single crystal substrate materials and even to conventionally cast substrate materials. The highly disturbed material and the geometric irregularity can result in TBC durabilities that are significantly below TBCs that do not have grooves or similar features. While the layer of disturbed material may be thicker or thinner, depending upon the manner in which material is removed to provide the grooves or other features, the layer of disturbed material exists and detrimentally affects the performance of a TBC system.

Although the present coating was developed for application in gas turbine engines, the invention clearly has utility in other applications where high temperatures are encountered, such as furnaces and internal combustion engines.

It is an object of the present invention to enable an improved method for providing grooves or other features in bond coats/substrates of TBC systems such that the TBC systems have improved durability.

It is another object to provide TBC systems that have grooves or other features in bond coats/substrates with improved durability.

Additional objects will become apparent to those skilled in the art based upon the following drawings and description.

SUMMARY OF THE INVENTION

According to one aspect of the invention, a method is disclosed for providing an article with a thermal barrier coating system having improved durability.

The method includes the steps of providing a substrate having an exposed surface; removing preselected portions of substrate material from the exposed surface of the substrate to provide predetermined three dimensional features on the substrate, with the step of removing preselected portions typically resulting in at least some adjacent areas of material which are disturbed; chemically treating the entire exposed surface of the substrate including the features to remove any disturbed material; and applying a layer of thermally insulating ceramic material to the substrate.

An article made in accordance with the method is also disclosed.

The present invention enables the production of TBC systems having significantly improved durability. Testing indicates TBC systems prepared according to the present invention have a 5× design life improvement over corresponding TBC systems with untreated grooves. While the present invention requires some additional work in the production of the TBC systems, the additional steps do not add significantly to the costs of production, and any additional cost is substantially outweighed by the improved durability.

DETAILED DESCRIPTION OF THE PREFERRED EMBODIMENTS

Figure 1:
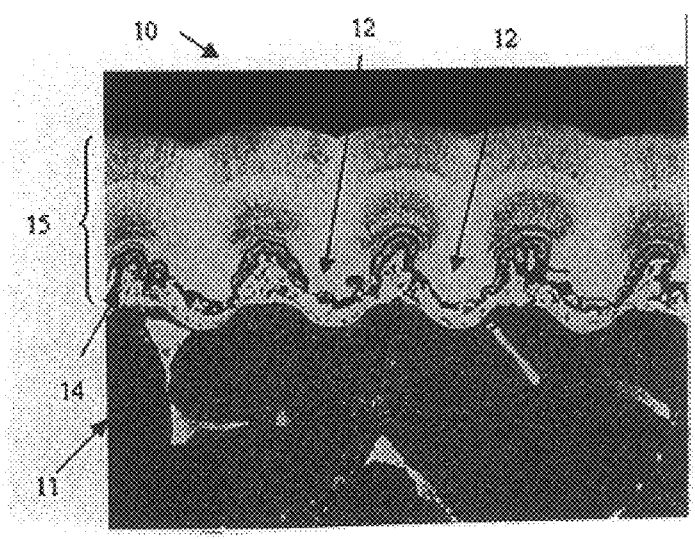
FIG. 1 is a photomicrograph of a substrate including laser-formed grooves, illustrating a layer of disturbed material.

Turning now to FIG. 1, an article such as a turbine airfoil prepared pursuant to U.S. Pat. No. 5,419,971 to Skelly et al. is illustrated by the reference numeral 10. While the present invention is not limited to use with any particular substrate material or to any particular article, the substrate illustrated in FIG. 1 is composed of a superalloy material, and more particularly a nickel base superalloy material capable of forming a thin adherent alumina layer. One exemplary material is described in commonly owned U.S. Pat. No. 4,719,080 to Duhl et al. As described below, an alternate embodiment employs a bond coat for the purpose of forming the alumina layer, with the features provided on the bond coat rather than the surface of the substrate.

The grooves were provided on the surface of the substrate using a laser, although other methods such as machining may also be employed with equal effect. While the present invention is illustrated with grooves as the features, the present invention is not limited to grooves or to any particular geometry of the features.

The illustrated grooves have a pitch of about 3 mils, that is the distance from peak to peak or trough to trough of adjacent grooves is about 3 mils, and the illustrated grooves are about 3 mils wide and deep, e.g., the grooves are provided right next to one another. The illustrated grooves have a generally arcuate cross section. The present invention is not limited to any particular feature geometry, or pitch, or width or depth. However, it is believed that as the pitch becomes greater than about 5–8 mils, the TBC system may be more erosion resistant but the cyclic thermal life will tend to decline.

As indicated in FIG. 1, a substrate 11 was provided with a series of grooves, indicated generally at 12 provided using a laser. The laser was a Lee Laser Inc. Series 800 Nd:YAG (model 818TQ—a Q switched CW device; as part of a General Scanning Inc Hi Mark Laser Marking System—model HM400), and delivering a total power of about 1100 milliwatts. The illustrated grooves were provided using about 90% power (about 1 W) at a pulse duration of about 5 micro seconds ($\mu$s) at a frequency of about 5 kHz and a ~3 mil spot. The beam was scanned along the substrate at about 360 inches per minute.

Figure 5:
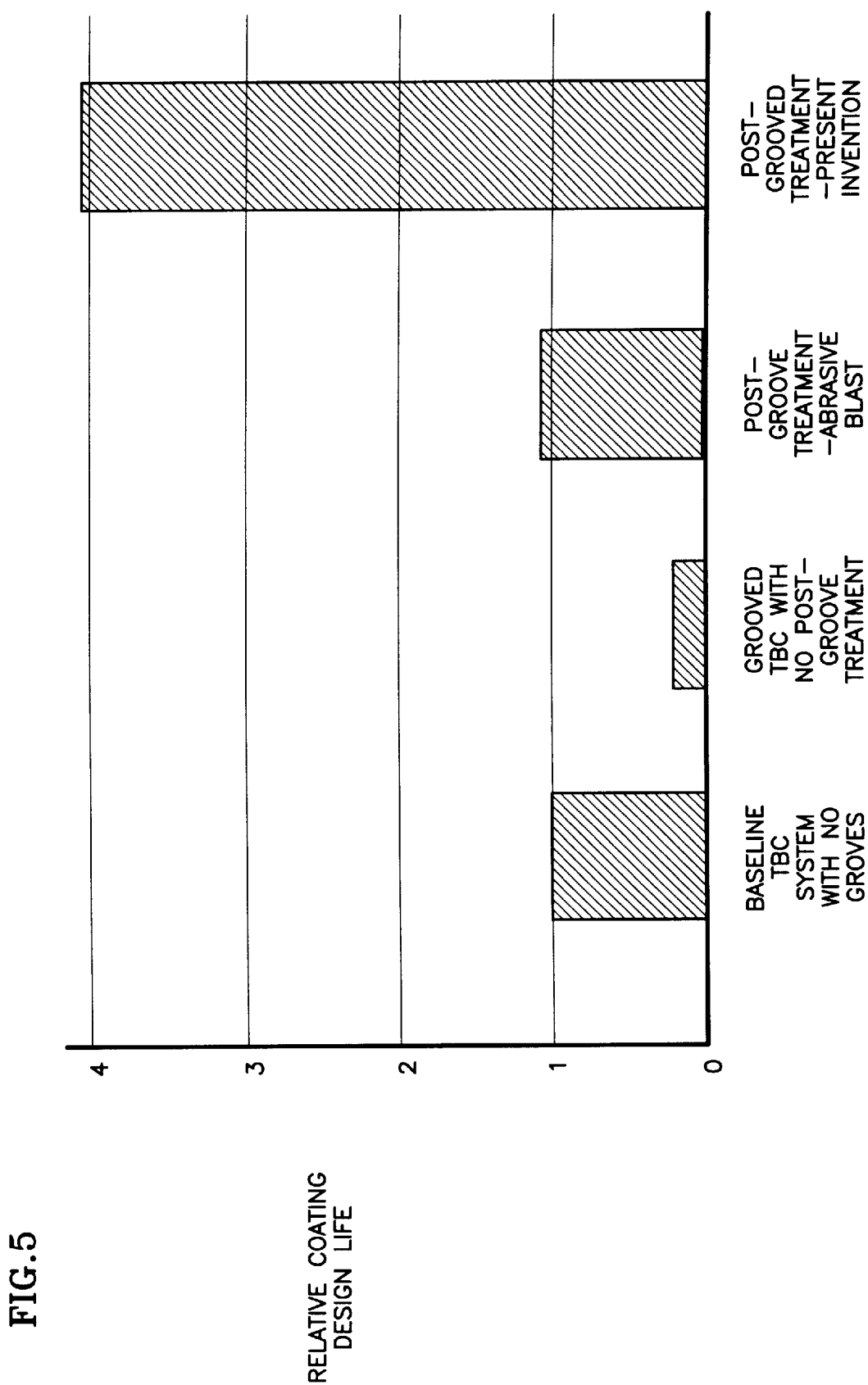
FIG. 5 is a plot illustrating relative design lives of various TBC systems.

A layer of disturbed material 14 is present over the substrate (and includes the uneven dark line on the grooves). The light area 15 over the grooves 12 and disturbed material 14 is nickel plate, applied to preserve the near-surface detail of the grooves during metallographic preparation, e.g., grinding and polishing, and is not part of the inventive TBC. The composition and structure of the disturbed material tends to vary depending upon the material and the method by which the grooves or other features are formed, and in the case of a laser, the disturbed material tends to be "re-cast" material. That is, the disturbed material is heated during removal of adjacent material, to a temperature near or above its melting point but not evaporated, and then cools. The disturbed material is microstructurally inferior to the underlying substrate material, and rough relative to the features to be provided, and provides numerous crack initiation locations. In the embodiment of FIG. 1, a thermally insulating ceramic layer, such as a stabilized zirconia, is applied by a suitable process. While we prefer EB-PVD as the process for demanding thermally cycled parts, we believe that the present invention is also useful with ceramics that are applied by thermal spray processes as well as other vapor deposition processes. As shown in FIG. 5, the presence of untreated disturbed material significantly and detrimentally affects the durability of a TBC system.

Figure 2:
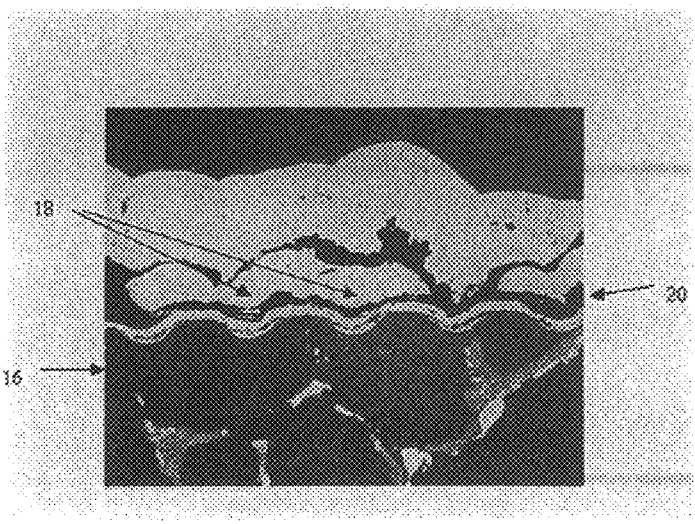
FIG. 2 is a photomicrograph of a substrate on which grooves, similar to FIG. 1, were treated by abrasive blasting.

FIG. 2 illustrates a substrate 16 with grooves 18, provided in a manner similar to FIG. 1. However, an attempt was made to remove the disturbed layer 20 of material by abrasive grit blasting. The grit blasting parameters may be varied by media, time, pressure and velocity at which the media are delivered, with care being taken not to remove significant amounts of the bond coat (if present, or the exposed surface of the substrate if no bond coat is present) or obliterating the features.

For example, the parts were grit blast with 240 mesh alumina, delivered at about 35 psi, with the media being delivered at 90 degrees (i.e., normal) to the coated surface of the article, in an effort to uniformly remove the disturbed material. The parts were grit blast until exhibiting a matte gray surface finish. The abrasive blasting successfully removed some of the disturbed material and removed some of the irregularity in the features, e.g., the horseshoe shaped portions of the features in FIG. 1, but some disturbed material 20 remained. As indicated in FIG. 5, the presence of a reduced amount of disturbed material, even after abrasive blasting, significantly and detrimentally affects the durability of a TBC system.

Figure 3:
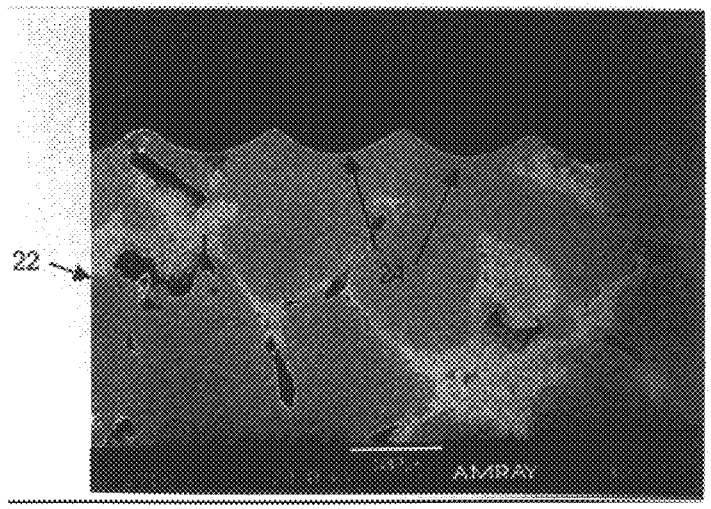
FIG. 3 is a photomicrograph of a substrate on which the grooves were treated according to the present invention.

FIG. 3 illustrates a substrate 22 with grooves 24 treated in accordance with the present invention. The grooves were not grit blasted, but instead a chemical etchant was applied to the entire surface of the coated article in an effort to completely remove the disturbed material while retaining the features. While we believe that various combinations of chemical etchants, solution temperatures and times may be employed in accordance with the invention, we have successfully used a solution of ferric sulfate (about 285 grams/liter) and hydrofluoric acid (70%) in an amount of about 50 ml/liter. The solution was maintained at about 170 F., and the parts were immersed in the solution for about 10 minutes. The solution and parts were mechanically agitated during part immersion. The parts were then rinsed with de-ionized water after immersion. This process retained the features provided by the laser while removing substantially all of the disturbed material, as indicated in FIG. 3. As suggested above, the etchant composition and etching parameters including time and temperature may be varied depending upon the particular metal (substrate/bond coat/re-cast) composition. The primary considerations are removal of the disturbed material without significantly altering the underlying, remaining material.

Figure 4:
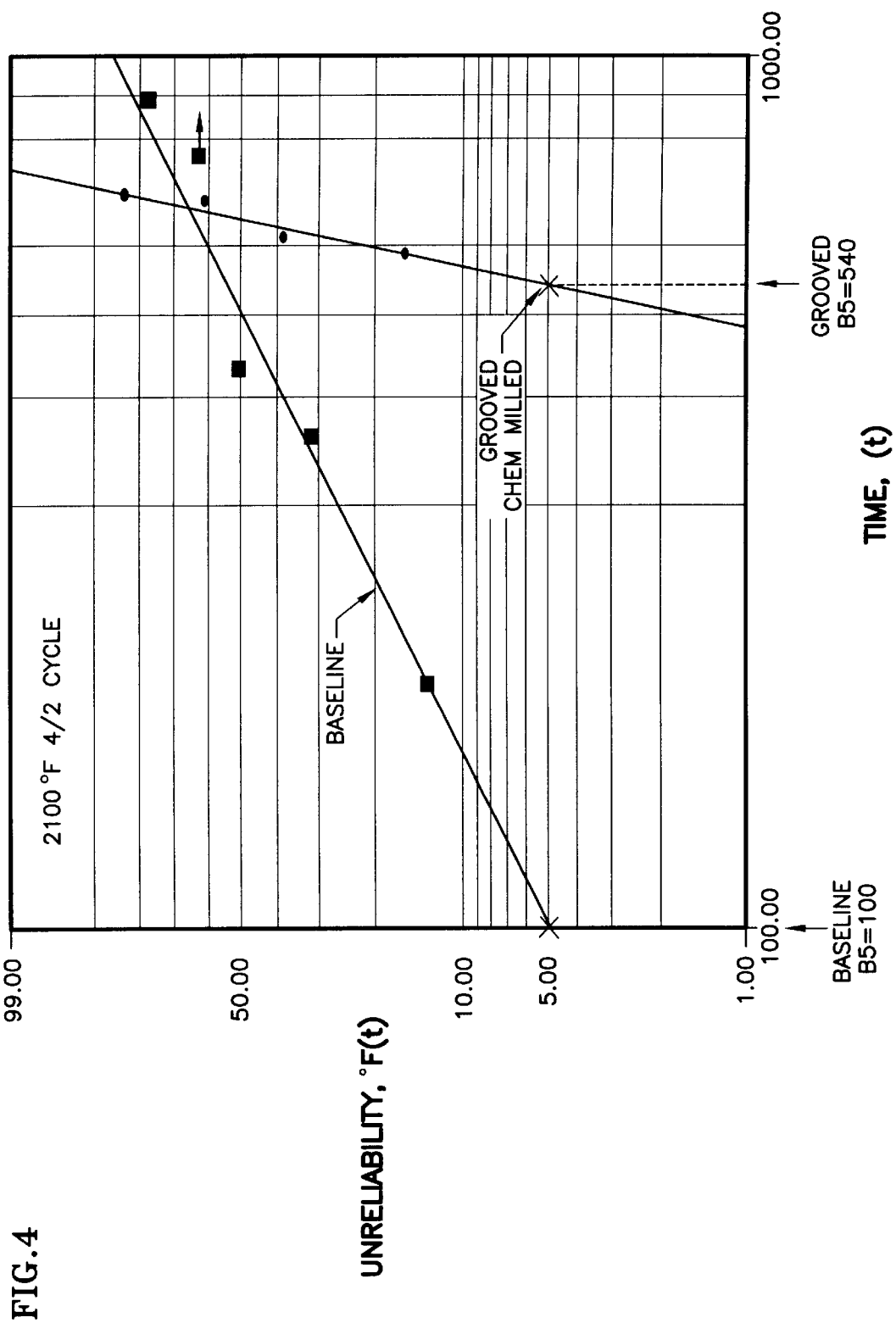
FIG. 4 is a plot of reliability over time for a TBC system produced in accordance with the present invention and for a conventional TBC system.
Figure 7:
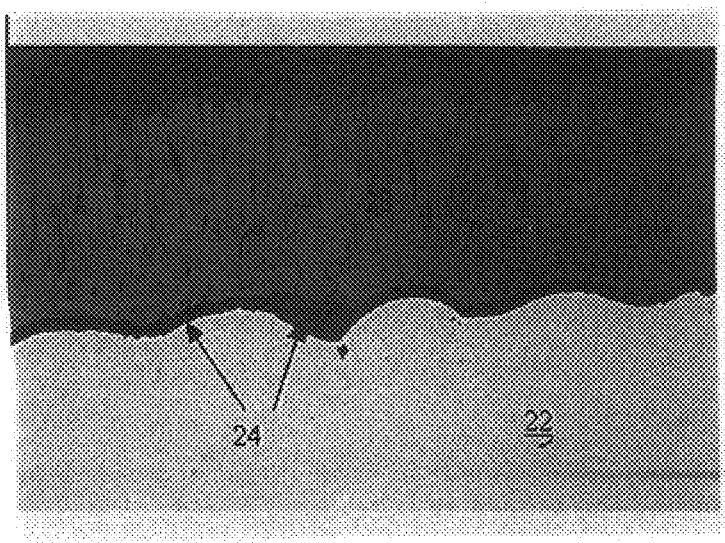
FIG. 7 is photomicrograph similar to FIG. 3, and including a ceramic thermally insulating layer.

FIG. 4 is a plot comparing the lifespan of a prior TBC system without grooves, provided on a superalloy capable of forming a thin adherent alumina scale onto which a ceramic thermally insulating layer is applied ("Baseline"—no bond coat TBC system) and a corresponding TBC system with grooves in accordance with the present invention ("Grooved and Chem Milled"). The prior TBC system is a "no bond coat" TBC system described, for example, in commonly owned U.S. Pat. No. 5,262,245 to Ulion et al., which is expressly incorporated by reference herein. Samples of a conventional, baseline "no bond coat" system (but without the grooves described with FIG. 1) were burner rig tested against samples of a "no bond coat" system incorporating the present invention (a sample is illustrated in FIG. 7). The test cycle included heating the samples to about 2100 F. for about 4 minutes, followed by forced air cooling of the samples for about 2 minutes. The results are shown in FIG. 4. Samples including untreated grooves, e.g., similar to the '971 patent in which grooves are provided and any disturbed material remains untreated, were also tested and exhibited lives only about 10–20% of baseline.

A low failure probability is typically used to limit the service life of parts such as turbine airfoils, since such parts fail rapidly in a high temperature operating environment after loss of the protective TBC system, and part failure can be catastrophic. Using a baseline for determining the useful life of a coated part, e.g., a turbine airfoil, at a failure probability of about 5%, the articles prepared pursuant to the present invention exhibit lives that are over 5× longer (more so considering that the low datum for the conventionally coated part was dropped). Moreover, the lives of articles prepared pursuant to the present invention are more uniform, i.e., there is much less scatter in the life of parts coated pursuant to the present invention. Accordingly and relative to prior coated articles, it is more likely the present articles will remain in use for longer periods between repair/refurbishment or replacement.

Figure 6:
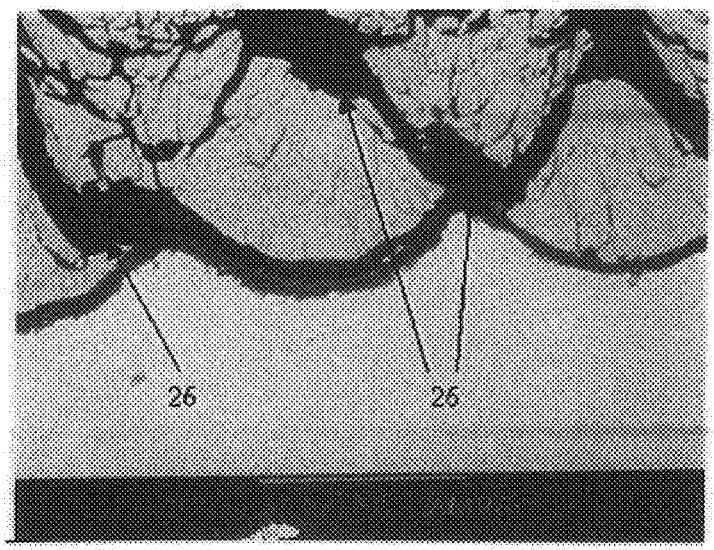
FIG. 6 is a photomicrograph of a substrate similar to FIG. 1 and illustrating severe oxidation.

FIG. 5 illustrates a comparison of several samples prepared pursuant to the above examples. The comparison was performed by heating coated samples to about 2100 F. for 4 minutes followed by forced air cooling of the samples for two minutes, until a given sample evidenced coating spallation, e.g., failure. The baseline sample was prepared pursuant to the above '245 patent. One set of samples was prepared in a manner to include grooves, similar to that described in FIG. 1 (and, as noted above, according to the '971 patent). These samples had a significantly shorter lives than the baseline, due primarily to the presence of the disturbed layer and the irregularity of the features described above. FIG. 6 illustrates the catastrophic oxidation and failure of such untreated grooves. Another set of samples was prepared with grooves, and the substrate and grooves were abrasive blasted to remove some of the disturbed layer and some of the irregularity of the features, similar to the description of FIG. 2. These samples had lives marginally better than the baseline. Still another set of samples was prepared in accordance with the present invention, i.e., grooves were provided by laser on the substrate and the substrate was then chemically etched to remove substantially all of the disturbed layer and provide regularity of the features. Surprisingly, these samples had a more than 4× improvement in life. We believe that the surprisingly increased improvement is due to the substantially complete removal of the disturbed layer, and to the improved "regularity" of the features.

In an alternate embodiment, a bond coat is applied to a substrate, and the grooves or other features are then formed on the bond coat rather than the substrate surface in the previous examples. The bond coat is an overlay type such as an MCrAl type, including MCrAlYs, described for example in commonly owned U.S. Pat. Nos. Re. 32,121 and 4,419, 416, or an aluminide type bond coat described for example in U.S. Pat. No. 5,514,482 which may also include one or more precious metals such as platinum, palladium or rhodium or other alloying elements. The benefits described with respect to the "no bond coat" TBC systems described above are equally applicable to TBC systems including a bond coat.

Samples of material including a superalloy substrate, an MCrAlY bond coat and ceramic insulating layer were compared. One set of samples was "conventional" in that the samples included no grooves in the bond coat. A second set of samples included grooves in the bond coat, provided in a manner similar to that described above, and the grooves were not treated prior to applying a ceramic thermally insulating layer. A third set of samples included a grooved bond coat, which was abrasive blasted prior to application of the ceramic. While the samples including untreated grooves and the samples which were grit blasted exhibited reduced lives relative to the baseline, first set of samples, the reduction was not nearly as great as the corresponding data for the "no bond coat" TBC systems described above. Treatment of the grooves according to the present invention will likewise greatly enhance the lives of grooved TBC systems. We believe that the relatively low reduction in lifespan of the bond coat system versus the "no bond coat" system is that the oxidation resistance the disturbed material, e.g., the re cast material which is essentially bond coat material, in the bond coat is superior to that of the substrate in the "no bond coat" TBC system, in which the re-cast or disturbed material exhibits poor oxidation resistance and tends to fail readily.

Figure 8:
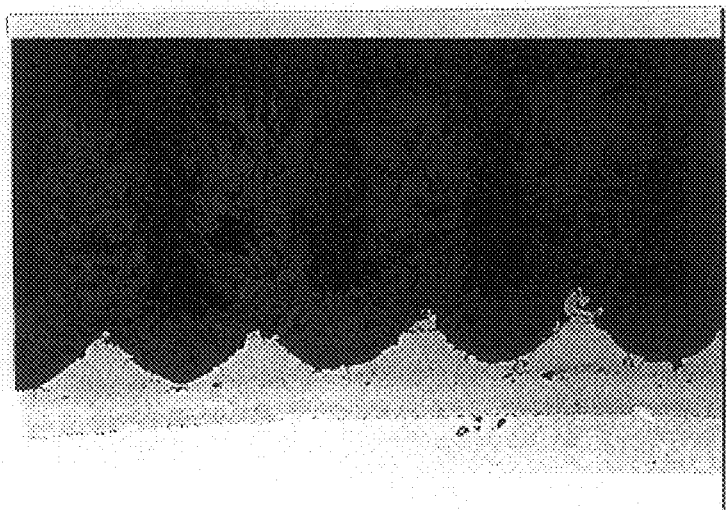
FIG. 8 is a photomicrograph of a substrate with an aluminide bond coat having untreated grooves, and a ceramic thermally insulating layer.

Testing of TBC systems incorporating an aluminide (see FIG. 8), such as a platinum aluminide, with untreated grooves shows some improvement over baseline (grooved substrate); however there is still some disturbed materials. The absence of a substantial debit in the presence of the disturbed layer is believed to be attributable the improved oxidation resistance of the aluminide underlying any recast relative to recast base metal. TBC systems incorporating grooved aluminide bond coats treated according to the present invention are expected to further improve the design life benefit of such systems. Moreover, use of the present invention may also improve the erosion resistance of these TBC systems incorporating aluminide bond coats.

As noted above, the present invention provided significant advantages over existing processes and articles. The present invention enables the production of TBC systems having significantly improved durability. Testing indicates TBC systems including "no bond coat" systems prepared according to the present invention have a 5× improvement in design life over corresponding conventional TBC systems. While the present invention requires some additional work in the production of the TBC systems, the additional steps do not add significantly to the costs of production and any costs are substantially outweighed by the improved durability. Moreover, the present invention can be employed during manufacture of the original component, or can also be employed during component repair, e.g., during engine overhaul.

While the present invention has been described above in some detail, numerous variations and substitutions may be made without departing from the spirit of the invention or the scope of the following claims. Accordingly, it is to be understood that the invention has been described by way of illustration and not by limitation.

What is claimed is:

1. A method of providing an article with a thermal barrier coating system having improved durability comprising the steps of:

providing a substrate having an exposed surface;

removing portions of substrate material from the exposed surface of the substrate to provide three dimensional features on the substrate;

chemically treating substantially all of the exposed surface of the substrate; and applying a layer of thermally insulating ceramic material to the substrate.

2. The method of claim 1, wherein the step of removing portions results in at least some adjacent areas of remaining material being disturbed, and the step of chemically treating removes substantially all of the disturbed material.

3. The method of claim 1, further comprising the step of: forming an adherent alumina scale on the substrate, the ceramic layer adhering to the alumina layer.

4. The method of claim 1, wherein the substrate is composed of nickel, cobalt or iron base superalloy material.

5. The method of claim 1, wherein the substrate defines a gas turbine engine component.

6. The method of claim 1, wherein the step of removing portions removes substrate material to provide grooves in the substrate.

7. The method of claim 1, wherein the grooves have a substantially uniform cross section after the step of chemically treating.

8. The method of claim 1, wherein the step of chemically treating includes applying a chemical etchant to substantially all of the exposed surface and the features.

9. The method of claim 1, wherein the step of chemically treating further removes material to provide more regular features.

10. A method of providing an article with a thermal barrier coating system having improved durability comprising the steps of:

providing a substrate;

applying a bond coat on the substrate;

removing portions of bond coat material to provide three dimensional features on the bond coat, the step of removing portions resulting in at least some adjacent areas of material which are disturbed;

chemically treating substantially all of the bond coat to remove any disturbed material; and applying a layer of thermally insulating ceramic material to the bond coat.

11. The method of claim 10, wherein the substrate is composed of a superalloy and defines a gas turbine engine component.

12. The method of claim 10, wherein the bond coat comprises an MCrAl type bond coat, M includes nickel, cobalt, iron and combinations thereof.

13. The method of claim 10, wherein the bond coat comprises an aluminide bond coat.

14. The method of claim 10, wherein the step of removing portions removes bond coat material to provide grooves in the bond coat.

15. The method of claim 10, wherein the features have a generally uniform cross section after the step of chemically treating.

16. The method of claim 10, wherein the step of chemically treating includes applying a chemical etchant to substantially all of the exposed surface and the features.

17. An article with a thermal barrier coating system having improved durability, the article made in accordance with a method comprising the steps of:

providing a substrate having an exposed surface;

removing portions of substrate material from the exposed surface of the substrate to provide three dimensional features on the substrate;

chemically treating substantially all of the exposed surface of the substrate and the features to remove any disturbed material produced during the step of removing; and applying a layer of thermally insulating ceramic material to the substrate.

18. The article of claim 17, wherein the article comprises a gas turbine engine component.

19. An article with a thermal barrier coating system having improved durability, the article made in accordance with a method comprising the steps of:

providing a substrate;

applying a bond coat on the substrate;

removing portions of bond coat material to provide three dimensional features on the bond coat, the step of removing portions resulting in at least some adjacent areas of material which are disturbed;

chemically treating the bond coat to remove any disturbed material; and applying a layer of thermally insulating ceramic material to the bond coat.

20. The article of claim 19, wherein the article comprises a gas turbine engine component.

* * * * *